United States Patent
Miyashita et al.

(10) Patent No.: US 9,291,764 B2
(45) Date of Patent: Mar. 22, 2016

(54) LIGHT EMITTING PACKAGE, SURFACE LIGHT-EMITTING DEVICE AND DISPLAY APPARATUS HAVING THE SAME

(75) Inventors: Junji Miyashita, Fujiyoshida (JP); Takumi Miyashita, Fujikawaguchiko-machi (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 671 days.

(21) Appl. No.: 11/950,815

(22) Filed: Dec. 5, 2007

(65) Prior Publication Data
US 2008/0158475 A1 Jul. 3, 2008

(30) Foreign Application Priority Data
Dec. 6, 2006 (JP) .................. 2006-330031

(51) Int. Cl.
*F21V 7/04* (2006.01)
*F21V 8/00* (2006.01)
*H01L 33/60* (2010.01)
*F21Y 103/00* (2006.01)

(52) U.S. Cl.
CPC .............. *G02B 6/0031* (2013.01); *H01L 33/60* (2013.01); *F21Y 2103/003* (2013.01)

(58) Field of Classification Search
CPC ................................. F21Y 2103/003
USPC ................................ 362/608–613
See application file for complete search history.

(56) References Cited

U.S. PATENT DOCUMENTS

| 7,157,853 | B2 | 1/2007 | Imai et al. | |
|---|---|---|---|---|
| 2005/0264716 | A1* | 12/2005 | Kim et al. | 349/61 |
| 2007/0008739 | A1* | 1/2007 | Kim et al. | 362/612 |
| 2007/0285944 | A1* | 12/2007 | Kiyohara et al. | 362/612 |

FOREIGN PATENT DOCUMENTS

| JP | H07-235207 | | 2/1994 | |
|---|---|---|---|---|
| JP | 2004-022245 | | 1/2004 | |
| JP | 2004022245 | A * | 1/2004 | F21V 8/00 |
| JP | 2005-347052 | A | 12/2005 | |
| JP | 2006-330031 | | 10/2006 | |

OTHER PUBLICATIONS

Notification of Office Action from the Japanese Patent Office, dated Dec. 27, 2010, with translation (5 pages).

* cited by examiner

*Primary Examiner* — Sean Gramling
(74) *Attorney, Agent, or Firm* — Brinks Gilson & Lione

(57) ABSTRACT

A light-emitting package allowing light to enter a thin lightguide plate efficiently has a package substrate 11, light-emitting elements 2 mounted on the package substrate, a transparent resin part 12 sealing the light-emitting elements on the package substrate, a cut portion 12a formed in the transparent resin part in parallel to the package substrate so as to be able to receive a side edge surface of a lightguide plate, and a reflecting layer 13 formed on the entire surface of the transparent resin part except the cut portion.

10 Claims, 2 Drawing Sheets

LIGHT EMITTING PACKAGE, SURFACE LIGHT-EMITTING DEVICE AND DISPLAY APPARATUS HAVING THE SAME

RELATED APPLICATIONS

This application claims priority under 35 U.S.C. §119 to Japanese Patent Application No. JP2006-330031 filed Dec. 6, 2006, the entire content of which is hereby incorporated by reference.

TECHNICAL FIELD

The present invention relates to a light-emitting package for use with a liquid crystal display panel of a mobile phone, for example. More particularly, the present invention relates to a light-emitting package capable of being reduced in thickness. The present invention also relates to a surface light-emitting device and display apparatus having the light-emitting package.

RELATED PRIOR ART

Generally, liquid crystal display apparatus for character or image display have been widely used as displays of mobile phones, personal digital assistants (PDAs) and so forth. These liquid crystal display apparatus employ a backlight unit that applies illuminating light to a liquid crystal display panel from the back thereof to enhance the luminance of the display screen.

FIG. 4 shows an example of such a backlight unit. The backlight unit includes a lightguide plate 1 and a light-emitting package 3 having a light-emitting element 2 comprising an LED (light-emitting diode) element. The light-emitting package 3 is provided along a side edge surface of the lightguide plate 1 to emit light into the lightguide plate 1. The backlight unit further includes a reflecting sheet 4 and a combination of a diffusing sheet 5, a first prism sheet 6 and a second prism sheet 7 through which light emitted from the surface of the lightguide plate 1 is passed. Light passing through the second prism sheet 7 is passed through a liquid crystal display panel (not shown) provided over the second prism sheet 7.

Recently, with the reduction in size and thickness of mobile phones, PDAs, etc., there has been a demand for backlight units and liquid crystal display apparatus to reduce in thickness. In this regard, the above-described conventional backlight unit structure suffers from a problem that the thickness of the lightguide plate 1 cannot be reduced because the lightguide plate 1 needs to have a thickness equal to the height of the light-emitting package 3 in order to receive light from the light-emitting package 3 through a side edge surface of the lightguide plate 1.

Meanwhile, Japanese Patent Application Publication No. 2005-347052 proposes a backlight unit structure in which a part of a lightguide plate that extends to a side edge surface thereof facing a light exit surface of a light-emitting package is gradually increased in thickness so that the side edge surface has the same height as the light exit surface, while reducing the overall thickness of the lightguide plate.

However, it is undesirable to form the lightguide plate in the above-described shape because the production cost increases in comparison to ordinary lightguide plates of simple flat plate shape.

SUMMARY OF THE INVENTION

An object of the present invention is to provide a light-emitting package that enables a lightguide plate to receive light from a light-emitting package appropriately even if the lightguide plate has a simple plate shape and is thin as a whole. Another object of the present invention is to provide a surface light-emitting device and a display apparatus using the above-described surface light-emitting device.

The present invention provides a light-emitting package including a package substrate and at least one light-emitting element mounted on the package substrate. The light-emitting package further includes a transparent resin part that seals the at least one light-emitting element on the package substrate, and a cut portion formed in the transparent resin part in parallel to the package substrate. The cut portion is capable of receiving a side edge portion of a lightguide plate. Further, the light-emitting package includes a reflecting layer formed on the entire surface of the transparent resin part except the cut portion.

In this light-emitting package, a cut portion is provided as stated above. Therefore, all light from the at least one light-emitting element is allowed to exit from the cut portion and to enter the lightguide plate efficiently through the side edge portion of the lightguide plate inserted in the cut portion. In other words, the lightguide plate can effectively use light from the light-emitting package despite the fact that the lightguide plate is thinner than the cut portion of the light-emitting package.

Specifically, the light-emitting package may be arranged such that the package substrate is rectangular, and the cut portion extends in the direction of length of the package substrate.

More specifically, the light-emitting package may be arranged as follows. The transparent resin part is formed in a rectangular parallelepiped shape on the package substrate and has a pair of edges extending parallel to the package substrate at respective positions remote from the package substrate. The cut portion is formed in the transparent resin part along one of the edges.

In this case, the cut portion may have a rectangular cross-section.

In addition, the present invention provides a surface light-emitting device including the above-described light-emitting package and a lightguide plate thinner than the transparent resin part. The lightguide plate has a side edge surface positioned in the cut portion to serve as an entrance surface. The lightguide plate is provided to extend in a direction perpendicular to the package substrate.

Because the lightguide plate can be made thin as stated above, the surface light-emitting device using the lightguide plate can also be reduced in thickness.

The surface light-emitting device may further include a flat reflecting sheet. In this case, the light-emitting package and the lightguide plate are provided on the reflecting sheet. The reflecting sheet reflects light exiting from the cut portion to prevent the light from leaking to the outside and to make it enter the lightguide plate. Thus, the reflecting sheet enables more efficient use of light. Further, because the light-emitting package and the lightguide plate are provided on the same flat reflecting sheet, it becomes easy to adjust the relative position between these two items.

In addition, the present invention provides a display apparatus including an image display panel and the above-described surface light-emitting device that is disposed at the back side of the image display panel to serve as a backlight unit.

Because the display apparatus uses the surface light-emitting device having the above-described light-emitting package and capable of being reduced in thickness, the display apparatus can also be reduced in overall thickness.

The image display panel may be a liquid crystal display panel.

DESCRIPTION OF THE PREFERRED EMBODIMENTS

An embodiment of the present invention will be explained below with reference to FIGS. 1 to 3.

Figure 2:
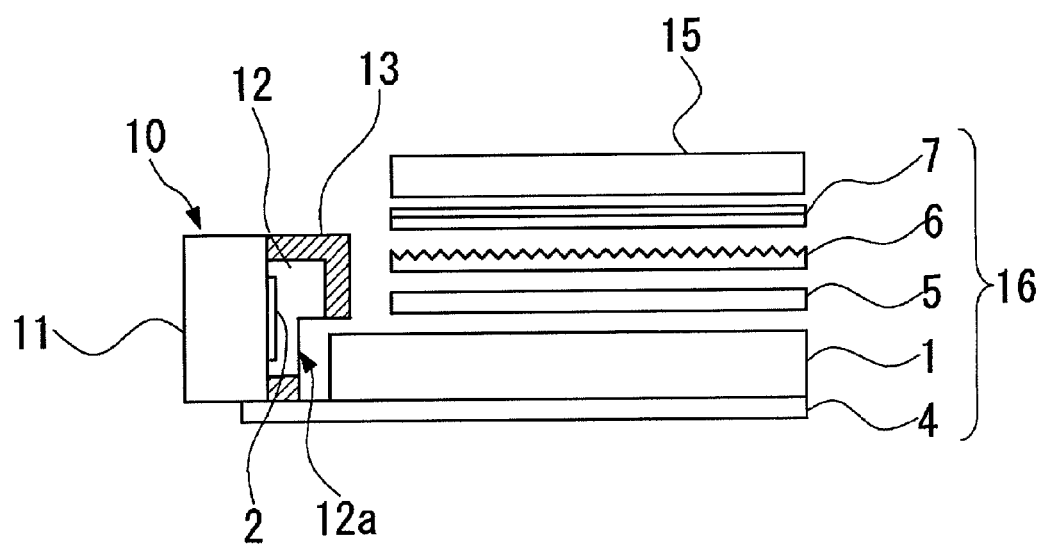
FIG. 2 is a partly-sectioned side view schematically showing a display apparatus having the light-emitting package shown in FIG. 1.
Figure 3:
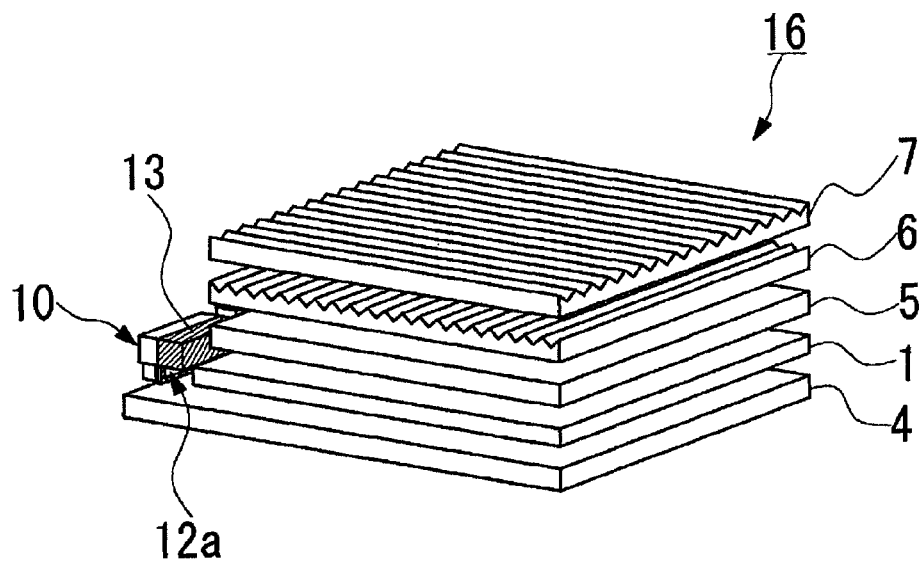
FIG. 3 is an exploded perspective view of a backlight unit of the display apparatus shown in FIG. 2.
Figure 4:
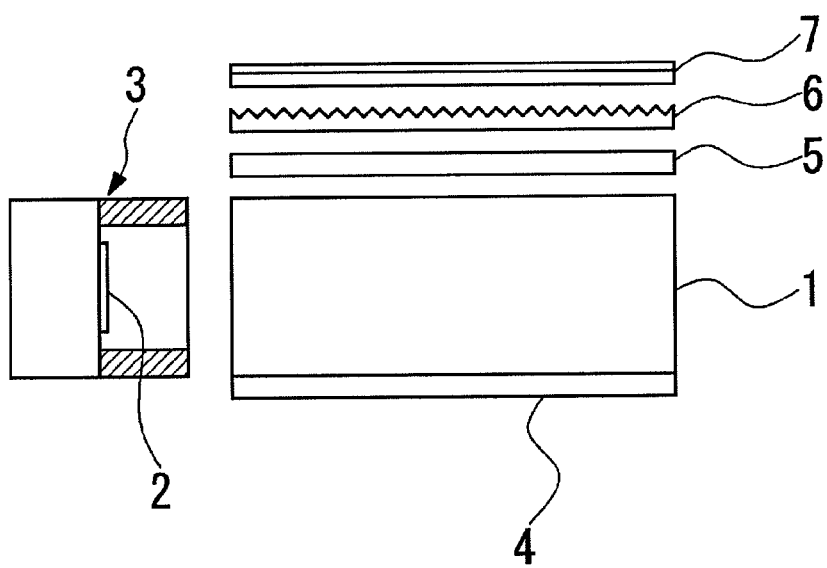
FIG. 4 is a partly-sectioned side view showing an example of conventional backlight units.

FIG. 2 shows a liquid crystal display apparatus applicable, for example, to a liquid crystal display panel of a mobile phone, a PDA, etc. The liquid crystal display apparatus includes a backlight unit (surface light-emitting device) 16 having a light-emitting package 10 and a liquid crystal display panel 15 that is illuminated by the backlight unit 16.

The backlight unit 16 has a light-emitting package 10, a lightguide plate 1, a diffusing sheet 5, a first prism sheet 6, a second prism sheet 7, and a reflecting sheet 4. The lightguide plate 1 receives light from the light-emitting package 10. The diffusing sheet 5 is provided directly above the lightguide plate 1 to uniformly diffuse light from the surface of the lightguide plate 1. The first prism sheet 6 and the second prism sheet 7 are provided directly above the diffusing sheet 5 to direct light from the surface (upper surface in FIG. 2) of the diffusing sheet 5 upward toward the liquid crystal display panel 15 as illuminating light. The reflecting sheet 4 is provided underneath the lightguide plate 1.

Figure 1:
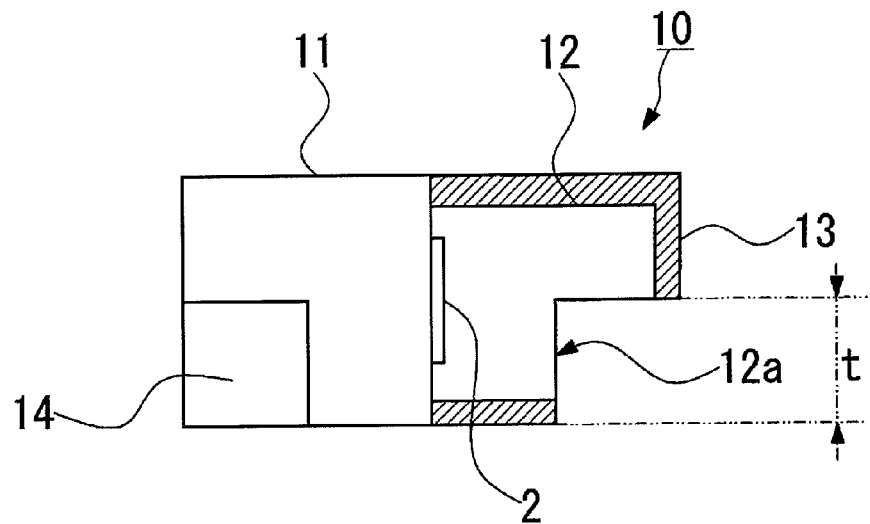
FIG. 1 is a partly-sectioned side view of a light-emitting package according to an embodiment of the present invention.

The light-emitting package 10 is, as shown in FIG. 1, provided along a side edge surface of the lightguide plate 1 and has a substantially rectangular parallelepiped-shaped package substrate 11. A plurality of light-emitting elements 2 are provided on the package substrate 11 at a predetermined spacing in the direction of the length of the package substrate 11. A rectangular transparent resin part 12 seals the light-emitting elements 2 on the package substrate 11. A reflecting layer 13 is formed on the surface of the transparent resin part 12. The reflecting layer 13 has a reflecting surface formed on the inner side thereof. The transparent resin part 12 has a cut portion 12a formed along an edge thereof closer to the lightguide plate 1. No reflecting layer 13 is formed on the cut portion 12a.

The plurality of light-emitting elements 2 are LED elements mounted on the package substrate 11. Specifically, each of the light-emitting elements 2 is a blue (wavelength λ: 470 to 490 nm) LED element or an ultraviolet (wavelength λ: less than 470 nm) LED element, which is formed, for example, by stacking a plurality of semiconductor layers of a gallium nitride compound semiconductor (e.g. InGaN compound semiconductor) on a sapphire substrate.

The transparent resin part 12 comprises, for example, a transparent silicone resin having YAG fluorescent substance added thereto. The YAG fluorescent substance converts blue or ultraviolet light from the light-emitting elements 2 into yellow light, and white light is produced by color mixing effect. It should be noted that various LED elements in addition to those described above can be used for emission of white light.

The package substrate 11 is formed from a glass epoxy resin, for example. The package substrate 11 has a pair of terminal patterns 14 provided on both ends thereof. The terminal patterns 14 are electrically connected to the electrodes of the light-emitting elements 2.

The reflecting layer 13 is formed by bonding a white resin or silver reflecting member to the transparent resin part 12, or by evaporating a metal having a light-reflecting function, e.g. aluminum, on the transparent resin part 12. That is, in the light-emitting package 10, light emitted from the light-emitting devices 2 is reflected by the reflecting layer 13 except at the cut portion 12a and allowed to exit only from the cut portion 12a.

The first prism sheet 6 and the second prism sheet 7 are transparent sheet-shaped members that collect light from the diffusing sheet 5 upwardly. The first and second prism sheets 6 and 7 have a plurality of mutually parallel elongated prisms on their respective upper sides. The first prism sheet 6 is placed so that its elongated prisms extend at a predetermined angle to the optical axis of light emitted from the light-emitting package 10 in plan view. To obtain high directivity in an upward direction, in particular, the elongated prisms of the first prism sheet 6 are set to perpendicularly intersect the optical axis of light from the light-emitting package 10 in plan view. The second prism sheet 7 is placed so that its elongated prisms extend at a predetermined angle, preferably at right angles, to the elongated prisms of the first prism sheet 6 in plan view.

The lightguide plate 1 has a thickness set not greater than the height t of the cut portion 12a of the transparent resin part 12 and is installed on the reflecting sheet 4. The lightguide plate 1 is formed from a transparent polycarbonate or acrylic resin, for example. The reflecting sheet 4 is mounted in the state of being bonded onto a flexible substrate (not shown).

The liquid crystal display panel 15 is a transmissive or semitransmissive type liquid crystal display panel. A semitransmissive liquid crystal display panel 15, for example, has a panel body having a liquid crystal material, e.g. TN liquid crystal or STN liquid crystal, sealed with a sealant in a gap between an upper substrate and a lower substrate, each having a transparent electrode, an alignment film and a polarizer. The semitransmissive liquid crystal display panel 15 further has a semitransmitting-reflecting sheet having both light-transmitting and -reflecting functions, which is provided underneath the panel body.

Thus, in the light-emitting package 10 of this embodiment, the transparent resin part 12 has the cut portion 12a, and the reflecting layer 13 is formed on the entire surface of the transparent resin part 12 except the cut portion 12a. Therefore, light from the light-emitting elements 2 is allowed to exit from the cut portion 12a. Because light enters the lightguide plate 1 through two surfaces (upper and side surfaces) that define the cut portion 12a, the lightguide plate 1 can take in light efficiently even if it is thin.

In the backlight unit 16, a thin lightguide plate 1 having a thickness set not greater than the height t of the cut portion 12a of the light-emitting package 10 is installed in such a manner that its side edge portion serving as an entrance surface is inserted into the cut portion 12a. Therefore, the lightguide plate 1 can appropriately receive light from the light-emitting package 10 without loss.

Because the light-emitting package 10 and the lightguide plate 1 are installed on the reflecting sheet 4, the respective lower surfaces of the light-emitting package 10 and the lightguide plate 1 are flush with each other. Accordingly, it is possible to prevent displacement between the light-emitting package 10 and the lightguide plate 1 in the height direction when they are installed, and hence possible to allow exiting light from the light-emitting package 10 to enter the lightguide plate 1 with high accuracy.

Because the backlight unit 16 is arranged as stated above, it can be reduced in thickness as a whole. Consequently, a liquid crystal display apparatus having the backlight unit 16 can also be reduced in overall thickness.

It should be noted that the present invention is not necessarily limited to the foregoing embodiment but can be modified in a variety of ways without departing from the scope of the present invention.

For example, the light-emitting package 10 may be a single light-emitting package having substantially the same length as the side edge surface of the lightguide plate 1. Alternatively, it may comprise a plurality of light-emitting packages provided along the side edge surface of the lightguide plate 1 at a predetermined spacing.

Although in the foregoing embodiment the light-emitting package 10 has a cut portion 12a of rectangular cross-section, the cut portion 12a may have other cross-sectional configuration. For example, if the lightguide plate 1 has a slanting or arcuate side edge surface, not a rectangular one, the cut portion 12a may be formed in conformity with the side edge surface configuration.

Although in the foregoing embodiment the backlight unit 16 uses the diffusing sheet 5, the diffusing sheet 5 may be omitted.

Although the foregoing embodiment uses the liquid crystal display panel 15 as an image display panel, other types of image display panels may be used, for example, an electronic paper.

What is claimed is:

1. A light-emitting package comprising:
   a single package substrate;
   a plurality of light-emitting elements mounted on the single package substrate at a predetermined spacing in a length direction of the single package substrate;
   a single transparent resin part that is formed in a rectangular parallelepiped with a single cut portion and seals the plurality of light-emitting elements mounted on the single package substrate, the single transparent resin part and the single cut portion extending in the length direction of the single package substrate; and
   a reflecting layer formed on an entire surface of the single transparent resin part except the single cut portion that extends in the length direction of the single package substrate;
   wherein the single cut portion is composed of two surfaces that extend along an edge of the single transparent resin part, and the two surfaces of the single cut portion is configured to emit light.

2. The light-emitting package of claim 1, wherein the single package substrate is rectangular.

3. The light-emitting package of claim 1, wherein the single cut portion has a rectangular cross-section.

4. The light-emitting package according to claim 1, wherein the transparent resin part comprises fluorescent substance.

5. A surface light-emitting device comprising:
   the light-emitting package of claim 1;
   a lightguide plate including a side edge portion and being thinner than the transparent resin part that seals the at least one light-emitting element of the light-emitting package, the side edge portion of the lightguide plate being arranged in the cut portion of the transparent resin part, and the lightguide plate being configured to receive light from the light-emitting package through upper and side surfaces of the lightguide plate.

6. The surface light-emitting device of claim 5, further comprising:
   a flat reflecting sheet;
   wherein the light-emitting package and the lightguide plate are provided on the reflecting sheet.

7. The surface light-emitting device according to claim 6, wherein the cut portion of the transparent resin part is positioned adjacent to the reflecting sheet on which the light-emitting package and the light-guide plate are provided.

8. A display apparatus comprising:
   an image display panel; wherein
   the surface light-emitting device of claim 5 is disposed at a back side of the image display panel to serve as a backlight unit.

9. The display apparatus of claim 8, wherein the image display panel is a liquid crystal display panel.

10. The light-emitting device according to claim 5, wherein the lightguide plate has a rectangular plate shape.

* * * * *